United States Patent [19]
Smith et al.

[11] 4,159,540
[45] Jun. 26, 1979

[54] MEMORY ARRAY ADDRESS BUFFER WITH LEVEL SHIFTING

[75] Inventors: Philip C. Smith, Laurel; John L. Fagan, Pasadena, both of Md.

[73] Assignee: Westinghouse Electric Corp., Pittsburgh, Pa.

[21] Appl. No.: 929,625

[22] Filed: Jul. 31, 1978

Related U.S. Application Data

[62] Division of Ser. No. 837,791, Sep. 29, 1977, Pat. No. 4,124,900.

[51] Int. Cl.² .............................................. G11C 8/00
[52] U.S. Cl. ............................... 365/230; 307/DIG. 1
[58] Field of Search .......... 365/230; 307/264, DIG. 1

[56] References Cited
U.S. PATENT DOCUMENTS

| | | | |
|---|---|---|---|
| 3,848,237 | 11/1974 | Geilhufe et al. | 365/230 |
| 3,976,984 | 8/1976 | Hirasawa | 365/230 |

*Primary Examiner*—Stuart N. Hecker
*Attorney, Agent, or Firm*—R. M. Trepp

[57] ABSTRACT

An improved electrically alterable non-volatile memory for storing information is described incorporating an array of memory cells composed of variable threshold field effect transistors, means for writing and reading information into and out of the array which includes precharged circuitry to provide predetermined voltages on the gate, source and drain electrodes of the transistors in the array before writing or reading and row decode circuitry on both sides of the array to permit closer spacing of the variable threshold transistors in the array.

3 Claims, 12 Drawing Figures

MEMORY ARRAY ADDRESS BUFFER WITH LEVEL SHIFTING

This is a division of application Ser. No. 837,791 filed Sept. 29, 1977, now U.S. Pat. No. 4,124,900.

BACKGROUND OF THE INVENTION

This invention relates to semiconductor memories, particularly to non-volatile memories using variable threshold transistors.

DESCRIPTION OF THE PRIOR ART

Non-volatile random access semiconductor arrays have been described in the prior art using variable threshold transistors. An example of a variable threshold transistor would be a metal nitride oxide semiconductor (MNOS) transistor. Normally a random access semiconductor memory is designed for relatively fast read and write cycle times so that data may be entered and extracted with a minimum of delay such as a read or write cycle time of one microsecond or less. A variation of a random access semiconductor memory is an electrically alterable read only memory wherein the read cycle times are fast such as on the order of one microsecond or less and the write cycle times are slow on the order of one millisecond or more and sometimes require additional peripheral circuitry to generate proper waveforms at proper voltages for writing. Normally the read only memory is a fixed memory such as a microprogram which is read over and over without changing its data. In the event of system changes where the data in the program must be altered additional circuitry is activated to execute a write cycle to alter the contents of the memory. One approach to altering the contents of the memory is to erase the entire memory or to set all the threshold voltages of the variable threshold transistors to one threshold voltage such as −2 volts and then to sequence through the memory array writing logic ones by shifting the threshold of the variable threshold transistor to another threshold voltage such as −10 volts. In a random access semiconductor memory information can be written into the array without disturbing adjacent memory cells or having to clear the entire array by setting the variable threshold transistors to one threshold voltage.

In a typical random access semiconductor memory, the variable threshold transistors are arranged in an array forming rows and columns in the X and Y direction. Address and decode circuitry is provided for selecting the desired row and column in the array for reading or writing information. The row decoder circuitry is located on one side of the memory array and coupled to each row by a conductor which runs parallel to the row. The column decode circuitry normally is located at the bottom of the memory array and is coupled to each column by a conductor which runs parallel with the columns. For proper operation of the memory normally the conductors running within the memory array parallel to the rows and parallel to the columns are precharged to predetermined voltages prior to selection of one of the rows by pulling the conductor running parallel to the row to a predetermined voltage and pulling the conductor parallel to the column to a predetermined voltage. The circuitry required to precharge the row and column lines internal to the array take up additional space on the semiconductor chip and sometimes are located on the other side of the memory array opposite the row decoders.

In order to write and clear variable threshold transistors in a memory array, row line voltages and memory substrate voltages of −25 volts are required. To control selection of one of several row lines, a row decode is required. On bulk silicon (p channel) a −25 volt selected decode row lines requires address signal lines of −30 volts. If the negative power supply is −30 volts, and if the address signal lines from the address buffer are at −30 volts, a −35 volt logic signal is required to control the gate of the load devices of the address buffer address signal lines.

Having −35 volt signals on a semiconductor chip is a problem because isolated substrates are required for the memory array and control logic circuitry. The higher the signal voltage, the thicker the epi layer required and the deeper the diffusion necessary to isolate epitaxial regions. Generation and use of −35 volts control signals also require special drivers and significant power dissipation.

It is therefore desirable to use of a contemplated depletion mode load element which allows the address signal lines to reach −30 volts without the use of high voltage control signals such as −35 volts.

It is desirable to simplify the circuitry to precharge memory gate rows and column rows prior to selecting a row by the decode circuitry.

It is desirable to improve the layout of the row decoders to reduce the overall semiconductor area required by the row decoders and the memory array.

It is desirable to reduce the number of pins to a semiconductor random access memory chip by combining a control signal with a power supply voltage.

SUMMARY OF THE INVENTION

In accordance with the present invention, an electrically alterable non-volatile memory is provided for storing information comprising a substrate, an array of electrically alterable non-volatile memory elements arranged in a number of rows in a predetermined area on the substrate, the rows being colinear and parallel to one another and extending to a first and second side of the area, a first group of at least two rows interleaved between a second group of at least three rows, the memory elements of each row of the first and second groups coupled to a conductor running along each row, first decode logic coupled to the conductors of the first group of rows on the first side of the area for selecting one of the rows in response to a number of predetermined addresses, second decode logic coupled to the conductors of the second group of rows on the second side of the area for selecting one of the rows in response to a number of predetermined addresses, and means coupled to the array of memory elements for clearing the array of memory elements to a first predetermined threshold voltage, means coupled to the array of memory elements for writing selected memory elements to a second predetermined threshold voltage, and means coupled to the array of memory elements for reading selected memory elements.

The invention further provides a semiconductor memory array for storing information comprising a plurality of memory cells arranged in a matrix having a plurality of rows and a plurality of columns, each of the memory cells include at least one variable threshold field effect transistor, means for clearing all of the memory cells to a first information state by setting the threshold voltage of each of the variable threshold transistors to a predetermined voltage in the memory cells, means for writing a second information state into a selected memory cell by varying the threshold voltage of one of the variable threshold transistors in the memory cell, and means for reading information from a selected memory cell by sensing the information state of the selected memory cell, wherein the means for writing and means for reading includes circuitry utilizing P-channel depletion mode field effect transistors having a gate, source and drain electrode to eliminate a threshold voltage drop between the gate and source electrode to permit the voltage of the source to be pulled to the potential of the drain.

The invention further provides a non-volatile semiconductor memory array row decoder for precharging a plurality of rows of memory cells in the array at a first time and for selecting one of the rows at a second time following the first time comprising a first circuit node, a plurality of circuit paths from said first circuit node to each of the rows, each of the circuit paths including a plurality of field effect transistors, each having a gate, source and drain electrode, connected in series between the source and drain electrodes, means for coupling a plurality of address signals to the gates of the transistors to cause one circuit path to conduct current in response to the plurality of address signals, each address signal may be represented by its true or complement level, means for coupling the first circuit node to a first supply voltage in response to a write signal, means for coupling. the first circuit node to a second supply voltage in response to a read signal and means for coupling the first circuit node to a third supply voltage in response to a reset signal to precharge to a predetermined voltage, through the plurality of circuit paths, the plurality of rows at times when the potential of the plurality of address signals are all at a voltage to cause the transistors to conduct current.

The invention further provides a non-volatile semiconductor array address buffer for level shifting an address signal at times and for providing a predetermined potential at other times comprising a first field effect transistor having its gate coupled to an input address terminal, its source coupled to a first voltage supply, its drain coupled to the source of a second field effect transistor and to the gate of a third field effect transistor, the gate of the second transistor coupled to a first control signal terminal, the drain of the third transistor coupled to the source of a fourth field effect transistor and to the gate of a fifth field effect transistor, the drain of the fifth transistor coupled to the source of the sixth transistor, the drain of a seventh field effect transistor and to the gate of an eighth field effect transistor, the sources of the third, fifth, seventh and eighth transistors coupled to the first power supply, the gates of the fourth and sixth transistors coupled to the first control signal terminal, the drain of the eighth transistor coupled to the source of a ninth field effect transistor, to the gate and source of a tenth field effect transistor and to an address output terminal, the drains of the second, fourth, sixth, ninth and tenth transistors coupled to a second voltage supply, and the gates of the seventh and ninth transistors coupled to a second control signal terminal.

The invention further provides an electrically alterable non-volatile semiconductor array for storing information comprising a plurality of memory cells arranged in rows and columns to form the array, each of the memory cells comrising at least one variable threshold field effect transistor, the drain electrodes of one transistor per memory cell in a column of memory cells coupled together, the source electrodes of the one transistor per memory cell in the column of memory cells coupled together, first means for precharging to a potential the gates of the transistors at times prior to reading information from the array, second means for precharging to a potential the source and drain electrodes of the transistors at times prior to reading information from the array, means for writing information into the array and means for reading information from the array.

DESCRIPTION OF THE PREFERRED EMBODIMENTS

Figure 1:
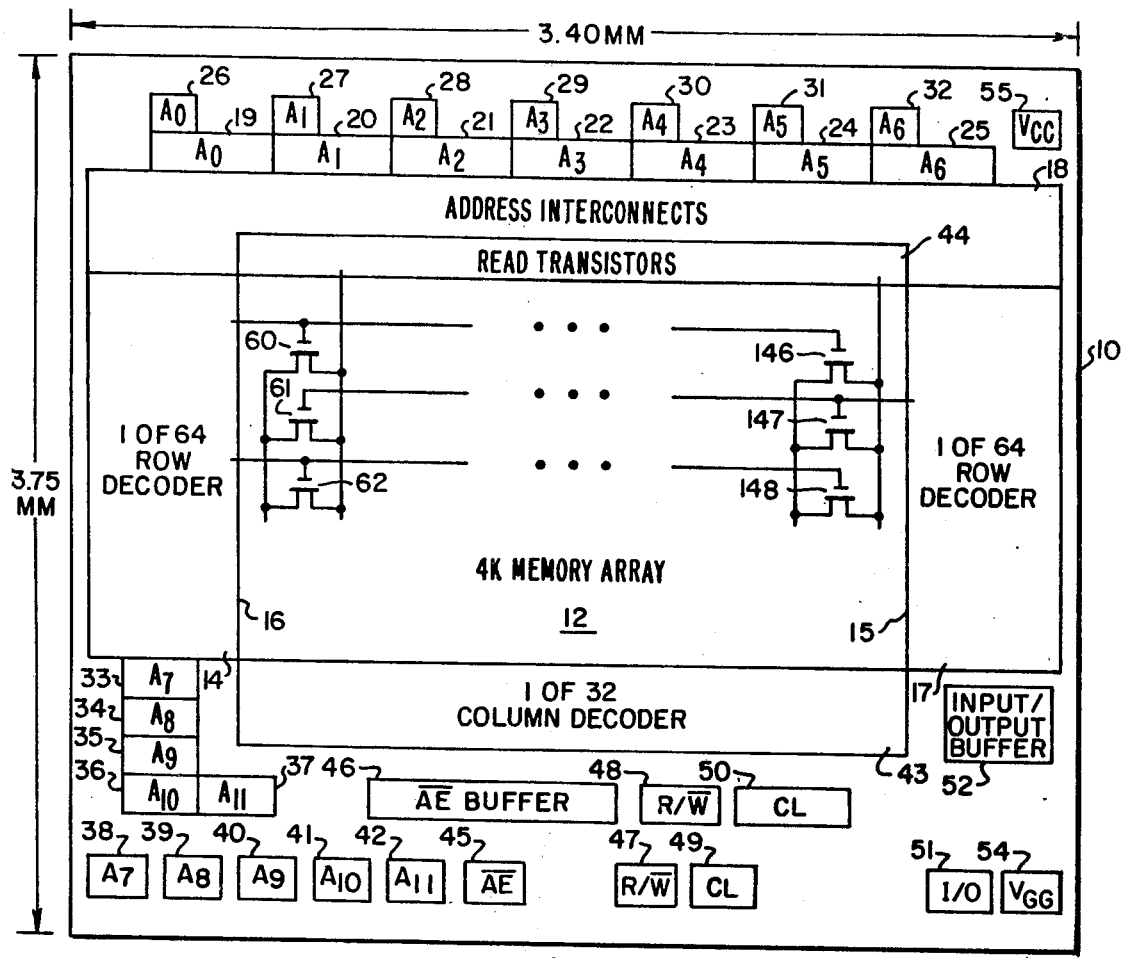
FIG. 1 shows a functional layout of the invention on a silicon substrate.

Referring now to the drawings, FIG. 1 shows a functional layout of a semiconductor memory array for storing information. Semiconductor substrate 10 which may, for example, be silicon or silicon on sapphire contains memory array 12 which may consist of rows and columns of memory cells each comprising one or more variable threshold transistors shown in more detail in FIGS. 2A and 2B. Memory array 12 may, for example, contain 4,096 memory cells. On a first side 16 of memory array 12 is located row decoder 14 which may, for example, decode one of sixty-four rows in memory array 12. On second side 15 of memory array 12 and opposite first side 16 is located row decoder 17 which may, for example, decode one of sixty-four rows in memory array 12. Row decoders 14 and 17 are coupled by means of address interconnects 18 to address buffers 19 through 25 which provide addresses A0 through A6. Input signals $A_0$ through $A_6$ are coupled to the address buffers 19 through 25 by means of address pads 26 through 32. Address pads 26 through 32 provide a contact area on substrate 10 for electrical connection by means of wire bonding. Address buffers 19 through 25 function to generate the true and complement address signal at times and at other times to clamp the output of the address buffers to predetermined voltages. Other address buffer 33 through 37 are coupled to address pads 38 through 42 for coupling in address signals $A_7$ through $A_{11}$. The output of address buffers 33 through 37 provide address signals A7 through A11 and their complement $\overline{A7}$ through $\overline{A11}$ to column decoder 43. Column decoder 43 functions to select a column of memory cells in memory array 12 for reading or writing. To facilitate reading the threshold state of a memory cell in a column, read transistors 44 are provided and are shown in more detail in FIG. 2.

Figure 4:
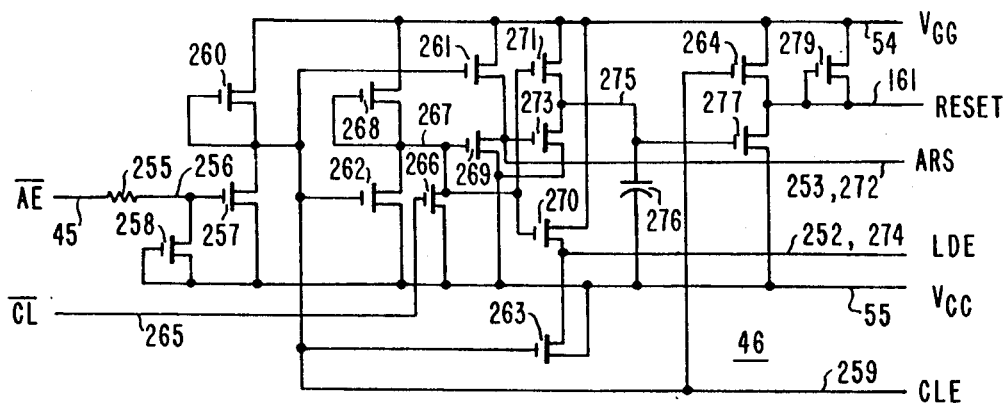
FIG. 4 shows a schematic diagram of an $\overline{AE}$ buffer.

A control signal $\overline{AE}$ may be coupled to bonding pad 45 which in turn is coupled to $\overline{AE}$ buffer 46 which is shown in more detail in FIG. 4 and functions to provide control signals on substrate 10 to facilitate reading and writing. A read/write signal may be coupled to pad 47 which in turn is coupled to an input of $\overline{R/W}$ control circuit 48 shown in more detail in FIG. 5. $\overline{R/W}$ control circuit functions to generate control signals to facilitate reading and writing information into/from memory array 12. A clear signal may be coupled to pad 49 which is coupled to clear control circuit 50 on substrate 10. Clear control circuit 50 is shown in more detail in FIG. 7 and functions to generate control signals to facilitate clearing memory array 12 to one information state. I/0 pad 51 is coupled to input/output buffer 52 which is shown in more detail in FIG. 2 and functions to couple data external of substrate 10 into memory array 12 where it may be stored. Data may be read from memory array 12 to input/output buffer 52 which provides sufficient drive for coupling the data off substrate 10. Voltages for operating substrate 10 may be, for example, $V_{GG}$ coupled to pad 54 and $V_{CC}$ coupled to pad 55. The voltages may be, for example, $V_{GG} = -30$ volts and $V_{CC} = 0$ volts.

Figure 2A:
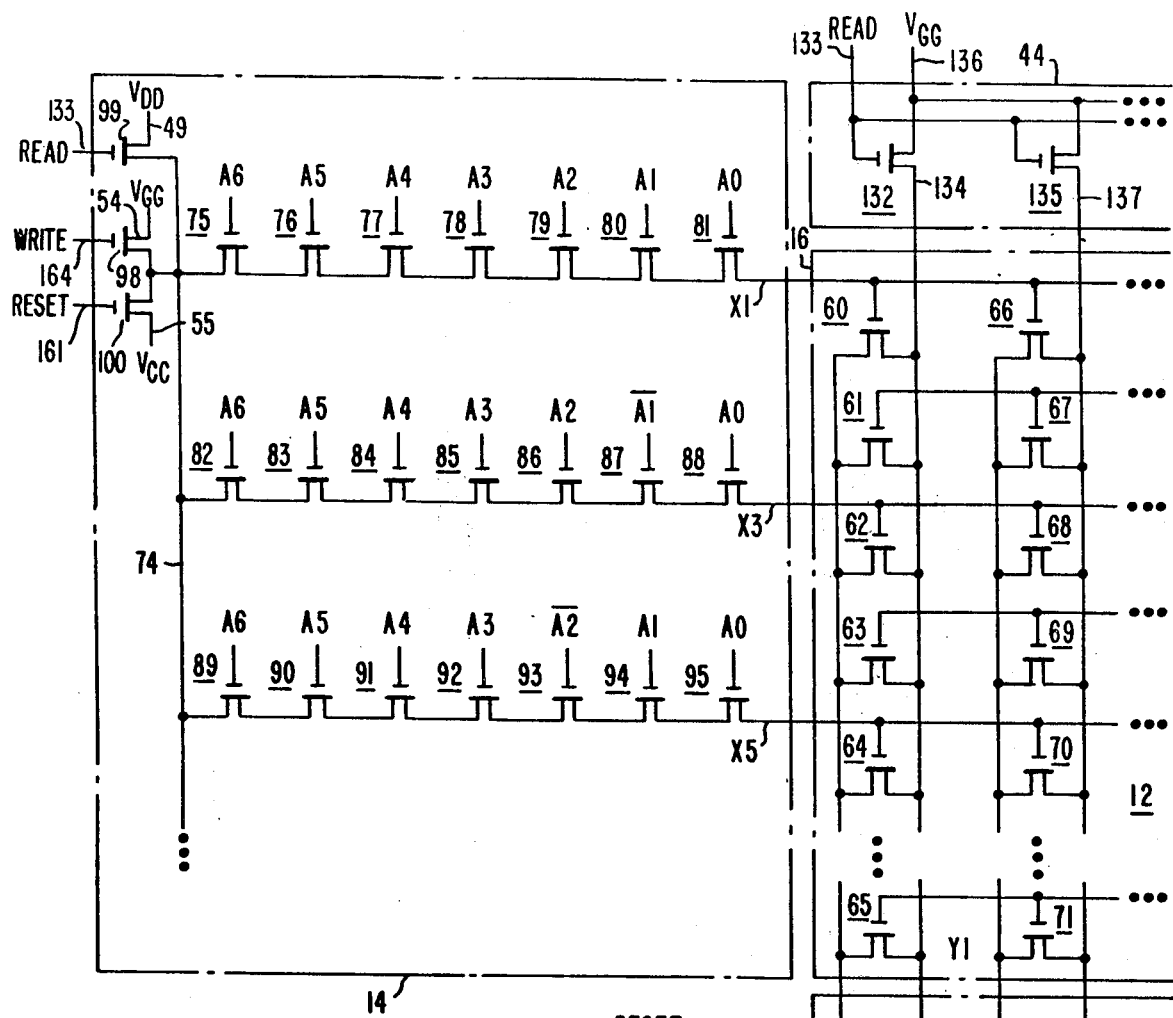
FIGS. 2A and 2B show a schematic diagram of the row decoders, memory array, column decoder and input/output buffer.
Figure 2C:
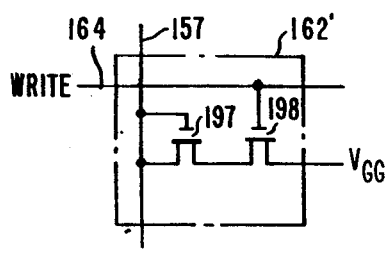
FIG. 2C shows an alternate embodiment of switch 102' in column decoder 43.
Figure 2B:
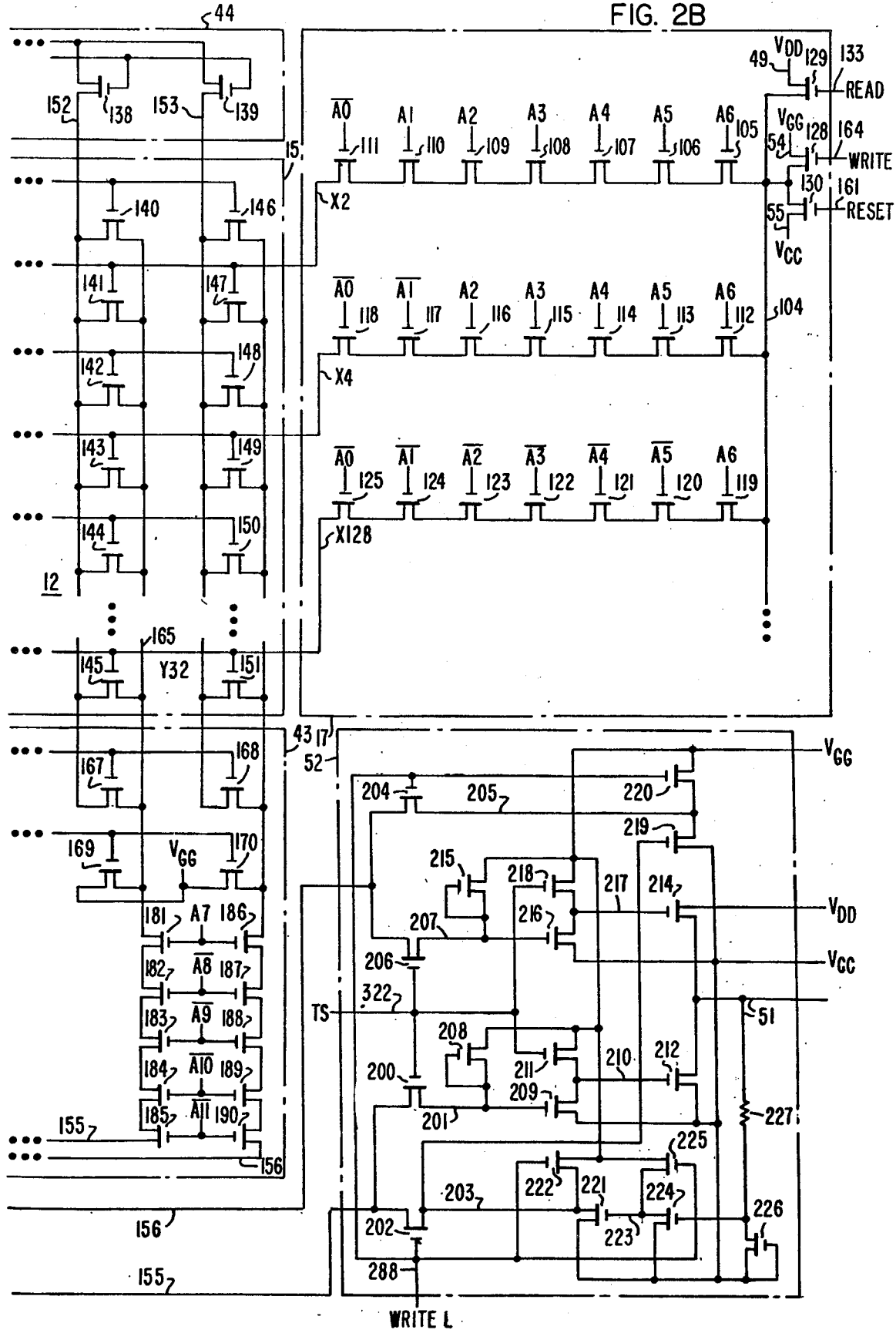

FIGS. 2A and 2B show a schematic diagram of circuitry for the row decoders 14 qnd 17, memory array 12, column decoder 43 and input/output buffer 52. Memory array 12 includes a plurality of memory cells arranged in an array or matrix having a plurality of rows and a plurality of columns. Memory array 12 may, for example, have 128 rows and 32 columns containing a total of 4,096 memory cells.

As shown in FIGS. 2A and 2B, each memory cell within memory array 12 includes two variable threshold field effect transistors each having a gate, source and drain electrode which may, for example, be a metal nitride oxide semiconductor (MNOS) transistor which is well known in the art.

In FIGS. 2A and 2B, a memory cell is formed by transistors 60 and 66, 61 and 67, 62 and 68, 63 and 69, 64 and 70, 65 and 71, 140 and 146, 141 and 147, 142 and 148, 143 and 149, 144 and 150, and 145 and 151. Rows 1 through 128 are designated as XI through X128 where row X1 includes transistors 60, 66, 140 and 146. Columns 1 through 32 may be designated as columns Y1 through Y32 wherein column Y1 includes transistors 60 through 65 and 66 through 71.

Row decoder 14 is coupled to memory array 12 and functions to precharge a plurality of rows of memory cells in memory array 12 at first times and to select one of the rows of memory cells at second times following the precharging of the memory rows. First circuit node 74 is coupled to a plurality of circuit paths wherein each circuit path is coupled to a row X1, X3, X5 ... X127 of memory array 12. Each of the circuit paths include a plurality of field effect transistors each having a gate, source and drain electrode and each connected in series between the source and drain electrodes. First circuit node 74 is coupled through transistors 75 through 81 to row X1 of memory array 12. First circuit node 74 is coupled through transistors 82 through 88 to row X3 of memory array 12. First circuit node 74 is coupled through transistors 89 through 95 to row X5 of memory array 12. In like manner odd-numbered rows such as X7 through X127 are coupled through a plurality of transistors to a first circuit node 74. The gates of the transistors in each circuit path to a row in memory array 12 are coupled to a plurality of address signals either its true or complement signal to cause one circuit path to conduct current in response to the plurality of address signals. Address signals A0 through A6 or their complements $\overline{A0}$ through $\overline{A6}$ function to select one row in memory array 12. Address signal A6 is coupled to the gate of transistors 75, 82 and 89. Address signal A5 is coupled to the gate of transistors 76, 83 and 90. Address signal A4 is coupled to the gate of transistors 77, 84 and 91. Address signal A3 is coupled to the gate of transistors 78, 85 and 92. Address signal A2 is coupled to the gate of transistors 79 and 86. Address signal $\overline{A2}$ is coupled to the gate of transistor 93. Address signal A1 is coupled to the gate of transistors 80 and 94. Address signal $\overline{A1}$ is coupled to the gate of transistor 87. Address signal A0 is coupled to the gates of transistors 81, 88 and 95.

Row decoder 14 includes a means for coupling the first circuit node 74 to a first supply voltage, $V_{GG}$, in response to the write signal on line 164. The means for coupling may, for example, be transistor 98 having a gate, source and drain electrode. The write signal is coupled over line 164 to the gate electrode of transistor 98. The first voltage supply $V_{GG}$ is coupled to the drain electrode of transistor 98. The source of transistor 98 is coupled to first circuit node 74. Row decoder 14 includes means for coupling the first circuit node 74 to a second supply voltage, $V_{DD}$, which is also signal CL on line 49 and at $-15$ volts during read operation, in response to the READ signal on line 133. The means for coupling the first circuit node 74 to $V_{DD}$ is provided by transistor 99 having its gate electrode coupled over line 133 to the READ signal and its drain electrode coupled to second voltage supply $V_{DD}$. The source of transistor 99 is coupled to first circuit node 74. Row decoder 14 includes means for coupling the first circuit node 74 to a third supply voltage, $V_{CC}$, in response to the RESET signal to precharge the rows in memory array 12 to a potential by means of the plurality of circuit paths at times when the potential of the plurality of address signals are all at a voltage to cause the transistors in the circuit paths to conduct current. The means for coupling may be provided by transistor 100 having a gate, source and drain electrode wherein the gate is coupled over line 161 to the RESET signal. The drain electrode of transistor 100 is coupled to first circuit node 84 and the source electrode of transistor 100 is coupled to third voltage supply, $V_{CC}$.

Row decoder 17 is coupled to memory array 12 to row lines X2 through X128. Row decoder 17 has the same structure and function as row decoder 14 except that the plurality of circuit paths X2 through X128 are coupled to rows X2 through X128 in memory array 12. Circuit paths X2 through X128 couple through a plurality of transistors to first circuit node 104. Circuit path X2 includes transistors 105 through 111. Circuit path X4 includes transistors 112 through 118 and circuit path X128 includes transistors 119 through 125. First circuit node 104 is coupled to first voltage supply, $V_{GG}$, through transistor 128. The gate electrode of transistor 128 is coupled over line 164 to the WRITE signal. First circuit node 104 is coupled to second voltage supply, $V_{DD}$ through transistor 129. The gate electrode of transistor 129 is coupled over line 133 to the READ signal. First circuit node 104 is coupled to third voltage supply, $V_{CC}$, through transistor 130. The gate electrode of transistor 130 is coupled over line 161 to the RESET signal. Transistors 128 through 130 may be eliminated if first circuit node 104 is coupled to first circuit node 74 of row decoder 14. Address signals A0 through A6 and $\overline{A0}$ through $\overline{A6}$ are coupled to the plurality of transistors in each circuit path to provide for the selection of one circuit path to be conducting current while all other circuit paths in row decoder 17 are nonconducting. By proper connection of the address signals one row or one circuit path of row decoder 17 is selected for each address at a time when row decoder 14 does not select any rows. In this manner one out of 64 rows which may, for example, be coupled to row decoder 17 may be selected at a time.

Read transistors 44 function to couple one side of the memory transistors in memory array 12 to first power supply, $V_{GG}$, under the control of READ signal. As shown in FIG. 2A, transistor 132 has its drain electrode coupled to $V_{GG}$, its gate electrode coupled over line 133 to READ signal and its source electrode coupled over line 134 to one side of one transistor of each memory cell in column Y1. The gate electrode of transistors 135, 138 and 139 are coupled over line 133 to the READ signal. The drain electrode of transistors 135, 138 and 139 are coupled over line 136 to the first power supply, $V_{GG}$. The source elecrode of transistor 135 is coupled over line 137 to one side of the second transistor of each memory cell in column Y1. The source electrode of transistor 138 is coupled over line 152 to one side of one transistor of each memory cell in column Y32. The source electrode of transistor 139 is coupled over line 153 to one side of the second transistor of each memory cell in column Y32. It is understod that additional transistors are provided in like manner for additional columns in memory array 12 which are not shown for columns Y2 through Y31. of transistors Column decoder 43 selects a column during read and write operation. During read operation the selected column in memory array 12 presents data to read latch 154 on lines 155 and 156 which will sense the data. Column decoder 43 provides voltages on the column lines in memory array 12 prior to the read, write and clear operation and during the write and clear operation. Line 157 is coupled to the sources of transistors 60 through 65 in column Y1 and line 158 is coupled to the source of transistos 66 through 71 of column Y1. Line 157 is coupled to line 134 through transistor 159 and line 158 is coupled to line 137 through transistor 160. The gate or control of transistors 159 and 160 is coupled to line 161 which is coupled to signal RESET. Line 157 is coupled through switch 162' to voltage supply $V_{GG}$. Switch 162' as shown in FIG. 2A comprises transistor 162. Line 158 is coupled through transistor 163 to voltage supply, $V_{GG}$. The control or gate switch 162' of transistor 162, and transitor 163 is coupled to line 164 which is coupled to signal WRITE. Column Y32 in memory array 12 has line 165 which is coupled to all the sources of transistors 140 through 145. Line 166 is coupled to all the sources of transistors 146 through 151 in column Y32. Line 165 is coupled through transistor 167 to line 152. Line 166 is coupled through transistor 168 to line 153. The control or gate of transistors 167 and 168 is coupled to line 161. Line 165 is coupled through transistor 169 to voltage supply, $V_{GG}$. Line 166 is coupled through transistor 170 to voltage supply, $V_{GG}$. The control or gate of transistors 169 and 170 is coupled to line 164. Line 157 is coupled through transistors 171 through 175 to line 155. Line 158 is coupled through transistors 176 through 180 to line 156. The gagte of transistor 171 and 176 is coupled to address signal A7. The vgate of transistors 172 and 177 is coupled to signal A8. The gate of transistors 173 and 178 is coupled to signal A9. The gate of transistors 174 and 179 is coupled to signal A10. The gate of transistors 175 and 180 is coupled to signal A11. Signals A7 through A11 represent a particular address to select column Y1 while not selecting columns Y2 through Y32. When column Y1 is selected signals A7 through A11 have such a value as to turn transistors 171 through 175 in the conducting state and transistors 176 through 180 into the conducting state. Whereupon the signals on lines 157 and 158 respectively will be transferred to or coupled to lines 155 and 156. Line 165 is coupled through transistors 181 through 185 to line 155. Line 166 is coupled through transistors 186 through 190 to line 156. The gate of transistors 181 and 186 are coupled together to address signal A7. The gate of transistors 182 and 187 are coupled together to address signal $\overline{A8}$. The gate of transistors 183 and 188 are coupled together to address signal $\overline{A9}$. The gate of transistors 184 and 189 are coupled together to address signal $\overline{A10}$. The gate of transitors 185 and 190 are coupled together to address signal $\overline{A11}$. The address signals coupled to the gates of transistors 181 and 185 and 186 through 190 are selected to decode column Y32 while not selecting columns Y1 through Y31 upon an appropriate address signal which turns transistors 181 through 190 into conduction and thereby couples line 165 to line 155 and line 166 to line 156 at the input of read latch 154.

Within read latch 154 line 155 is coupled through transistor 191 to line 192 which is coupled to signal $\overline{CL'}$. Line 155 is also coupled to the gate of transistor 193 and to the drain of transistor 194. Line 156 is coupled through transistor 193 to line 192. Line 156 is also coupled to the gate of transistor 191 and to the drain of transistor 195. Line 161 is coupled to the gate of transistors 194 and 195. The sources of transistors 194 and 195 are coupled to line 192. During read operation read latch 154 functions as an RS flip-flop which is set by either lines 155 or 156 depending upon which one has the lowest voltage due to discharging through column decoder 43 and the memory transistors of a particular memory cell such as transistors 60 and 66.

Input/output buffer 52 provides a bi-directional buffer circuit between column decoder 43 and read latch 154 and I/0 line 51. The signal on line 155 is coupled through transistor 200 to line 201 and through transistor 202 to line 203. Line 156 is coupled through transistor 204 to line 205 and through transistor 206 to line 207. Line 201 is coupled to the gate and source of transistor 208 and to the gate of transistor 209. The drain of transistor 208 is coupled to voltage supply $V_{GG}$. The source of transistor 209 is coupled to voltage supply $V_{CC}$. The drain of transistor 209 is coupled to line 210 to the source of transistor 211 and the gate of transistor 212. The drain of transistor 211 is coupled to voltage supply $V_{GG}$ and the source of transistor 212 is coupled to voltage supply $V_{CC}$. The drain of transistor 212 is coupled over line 51 to the source of transistor 214. Line 207 is coupled to the source and gate of transistor 215 and to the gate of transistor 216. The drain of transistor 215 is coupled to voltage supply, $V_{CC}$. The drain of transistor 216 is coupled over line 217 to the source of transistor 218 and to the gate of transistor 214. The drain of transistor 218 is coupled to voltage supply $V_{GG}$. The drain of transistor 214 is coupled to voltage supply $V_{DD}$. The gates of transistors 200, 206, 211 and 218 are coupled to signal TS and determine when the signal on lines 155 and 156 provide one output signal on line 51 which is provided by either transistor 212 or 214 conducting. When signal TS is OFF both transistors 212 and 214 are non-conducting and line 51 appears as open circuit.

Line 205 is coupled to the drain of transistor 219 and the source of transistor 220. The source of transistor 219 is coupled to voltage supply $V_{CC}$ and the drain of transistor 220 is coupled to voltage supply $V_{GG}$. The gate of transistor 220 is coupled to signal WRITE L. The gate of transistor 219 is coupled over line 203 to the drain of transistor 221 and the source of transistor 222. The gate of transistor 221 is coupled over line 223 to the drain of transistor 224 and the source of transistor 225. The drains of transistors 222 and 225 are coupled to voltage supply $V_{GG}$ and the source of transistors 221 and 224 are coupled to voltage supply $V_{CC}$. The gates of transistors 202, 204, 222 and 225 are coupled to signal WRITE L. The gate of transistor 224 is coupled to the drain of transistor 226 and through resistor 227 to line 51. Line 51 serves as an input of write data into the memory. The source and gate of transistor 226 are coupled to voltage supply $V_{CC}$. Transistor 226 and resistor 227 function as a discharge path for excess static voltage to protect the gate of transistor 224. Transistors 208 and 215 are P-channel depletion mode transistors which act as a current source to pull lines 207 and 201 to the voltage of voltage supply $V_{GG}$.

FIG. 2C shows an alternate embodiment of switch 162′ in column decoder 43. Transistors 163, 169, and 170 could also be replaced with the embodiment of FIG. 2C. In FIG. 2C, line 157 is coupled to the gate and source of transistor 197. The drain of transistor 197 is coupled to the source of transistor 198. The drain of transistor 198 is coupled to voltage supply $V_{GG}$ and the gate is coupled to signal WRITE over line 164. Transistor 197 is a p-channel depletion mode transistor and transistor 198 is a p-channel enchancement mode transistor. When signal WRITE is low, transistor 198 is conducting tending to pull line 157 low to $-25$ volts. The current through transistor 198 however is limited by transistor 197 to 25 microamperes, for example. The limited current through switch 162′ in FIG. 2C permits line 157 to be pulled closer to zero volts during write operation if line 155 is zero volts and column Y1 is selected by address lines A7 through A11. In FIG. 2A, switch 162′ relies upon the high impedance of transistor 162 to limit the current flow to voltage supply $V_{GG}$. Transistor 162 and transistors 171 through 175 act as a voltage divider between line 155 and voltage supply $V_{GG}$.

Figure 3:
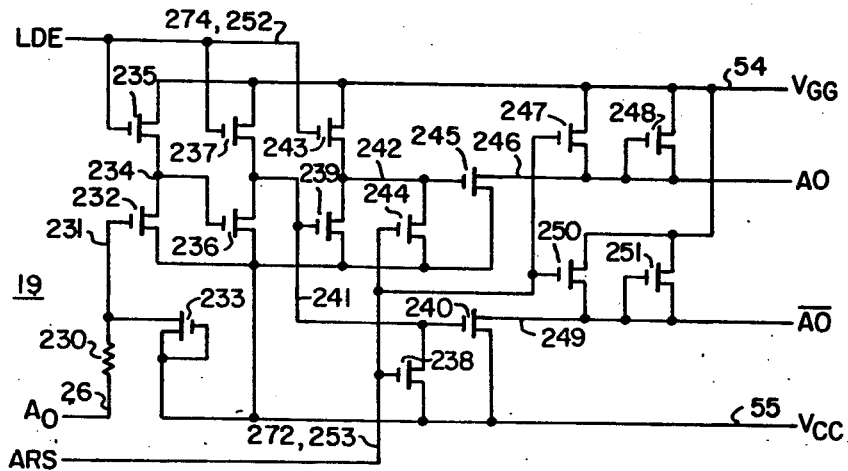
FIG. 3 shows a schematic diagram of an address buffer.

Referring to FIG. 3 an example of an address buffer 19 suitable for address buffers 19 through 25 and 33 through 37 of FIG. 1 is shown in schematic form. Address and 26 is coupled through resistor 230 over line 231 to the gate of transistor 232 and the drain of transistor 233. The gate and source of transistor 233 is coupled to voltage supply $V_{CC}$. Resistor 230 and transistor 233 function to provide a discharge path for excessive voltages such as static electricity on address pad 26. The drain of transistor 232 is coupled over line 234 to the source of transistor 235 and the gate of transistor 236. The drain of transistor 236 is coupled to the source of transistor 237 and the drain of transistor 238 and the gates of transistors 239 and 240 over line 241.

The drain of transistor 239 is coupled over line 242 to the source of transistor 243, the drain of transistor 244 and the gate of transistor 245. The drain of transistor 245 is coupled over line 246 to the source of transistor 247 and the gate and source of transistor 248. The drain of transistor 240 is coupled over line 249 to the source of transistor 250 and the gate and source of transistor 251. Line 249 provides an output signal $\overline{A0}$ which is the complement of the input signal $A_0$ on address pad 26. Line 245 provides an output signal A0 which is a true logic level of the input signal $A_0$ on address pad 26. Signals A0 and $\overline{A0}$ are address signals which go to row decoders 14 and 17. The gate of transistors 235, 237 and 243 are coupled over line 252 to signal LDE. The gate of transistors 238, 244, 250 and 247 are coupled over line 253 to signal ARS. The drain of transistors 235, 237, 243, 247, 248, 250 and 251 are coupled to voltage supply $V_{GG}$. The source of transistors 234, 236, 239, 244, 245, 238, and 240 are coupled to voltage supply $V_{CC}$. Voltage supply $V_{CC}$ may, for example, be zero volts and voltage supply $V_{GG}$ may, for example, be $-30$ volts. All the transistors in address buffer 19 are P-channel enhancement mode transistors except transistors 248 and 251 which are P-channel depletion mode transistors which act as resistor current sources to enhance the voltage swing of the output signal A0 and $\overline{A0}$ to the value of the voltage supply $V_{GG}$ or $-30$ volts.

In operation, address buffer 19 has an input signal such as $A_0$ on line 26 which causes transistor 232 to be conducting or non-conducting depending upon the voltage level of $A_0$. At times when the input signal on line 26 is desired at the output on line 246 with its complement on line 249 the control signals ARS is high such as at zero volts and LDE is low such as at $-25$ volts. With signal ARS at zero volts, transistors 238, 244, 247 and 250 are non-conducting. With signal LDE at $-25$ volts transistors 235, 237 and 243 are conducting and appear as resistor current sources with respect to transistor 232, 236 and 239. If $A_0$ on the gate of transistor 232 is zero volts, then line 234 will be drawn low by transistor 235 causing transistor 236 to be conducting which will pull line 241 high causing transistors 239 and 240 to be non-conducting. Line 242 will be pulled low by transistor 243 causing transistor 245 to be conducting causing line 246 to be pulled high to zero volts. Even though transistor 248 is conducting as a current source tending to pull line 246 low, the current passing through transistor 245 is sufficient to pull line 246 to zero volts. Line 249 is pulled low to $-30$ volts by transistor 251 if transistor 240 is non-conducting. Therefore, with zero volts on the input pad 26 of address buffer 19 output line 246 representing $A_0$ is at zero volts and output line 249 representing $\overline{A0}$ is at $-30$ volts.

If the input $A_0$ on gate 234 is low such as $-10$ volts, then transistor 232 will be conducting causing line 234 to be high. Transistor 236 will be non-conducting causing line 241 to be low and transistors 239 and 240 to be conducting. Line 242 will be high causing transistor 245 to be non-conducting and allowing line 246 to be pulled to $-30$ volts by transistor 248. Line 249 will be pulled to zero volts by transistor 240 which will supply enough current to override the current drawn through transistor 251 which acts as a current source. Therefore with the input $A_0$ on line 26 at $-10$ volts, the output voltage on line 246 representing A0 will be $-30$ volts and the output voltage on line 249 representing $\overline{A0}$ will be zero volts. When signal LDE goes high or to zero volts no current is drawn through transistors 235, 237 and 243 and the input A₀ on line 26 is disabled. When signal ARS goes from zero volts to −25 volts, transistors 244, 238, 247 and 250 are in the conducting state causing line 246, A0 and line 249, $\overline{A0}$, to be pulled low to −30 volts. Therefore when signal ARS goes to −25 volts address signals A0 and $\overline{A0}$ are clamped to −30 volts.

Referring to FIG. 4 a schematic diagram of $\overline{AE}$ buffer 46 is shown. signal $\overline{AE}$ is coupled to $\overline{AE}$ pad 45 or line 45 which is coupled through resistor 225 over line 256 to the gate of transistor 257 and the drain of transistor 258. The source and gate of transistor 258 is coupled to voltage supply $V_{CC}$. Resistor 255 and transistor 258 function to protect the gate of transistor 257 from excessive voltage such as static electricity. The drain of transistor 257 is coupled over line 259 to the gate and source of transistor 260, and the gates of transistors 261, 262, 263 and 264. Line 259 provides the signal CLE which is also distributed to the read control circuitry of FIG. 6 and the circuitry of FIG. 7. Signal $\overline{CL}$ which originates from the circuit shown in FIG. 7 is coupled over line 265 to the gate of transistor 266. The drain of transistor 266 is coupled over line 267 to the gate of transistors 268, 269, 270 and 271 and to the drain of transistor 262 and the source of transistor 268. The drain of transistor 269 is coupled over line 272 to the source of transistor 261, the gate of transistor 273. Line 272 provides the signal ARS to the address buffers such as address buffer 19 shown in FIG. 3. The drain of transistor 263 is coupled over line 274 to the source of transistor 270. Line 274 provides a signal LDE to the address buffers such as address buffer 19 shown in FIG. 3 and to read/write control circuitry 281 shown in FIG. 5. The drain of transistor 273 is coupled over line 275 to the source of transistor 271 to one side of capacitor 276 and to the gate of transistor 277. Capacitor 276 may have, for example, a value of 0.7 picofarads and functions to provide a fall time delay by slowing the discharge rate on line 275. The other side of capacitor 276 may be coupled to a voltage reference such as $V_{CC}$. The drain of transistor 277 is coupled over line 161 to the source of transistor 264 and the gate and source of transistor 279. Line 161 provides signal Reset which is used by row decoders 14 and 17, and column decoder 43 shown in FIGS. 2A and 2B, read/write control circuitry 281 in FIG. 5, and read control circuitry 298 in FIG. 6. Transistors 260, 268, 261, 270, 270, 271, 264 and 279 are coupled to voltage supply $V_{GG}$ which may be −30 volts. The source of transistors 258, 257, 262, 269, 266, 263, 273, and 277 are coupled to voltage supply $V_{CC}$ which may be zero volts. The gate of transistor 258 is also coupled to voltage supply $V_{CC}$. Transistors 260, 268 and 279 are P-channel depletion mode transistors to provide a current source to −30 volts and to pull its source down to −30 volts. All other transistors in FIG. 4 are P-channel enhancement mode transistors.

Figure 8:
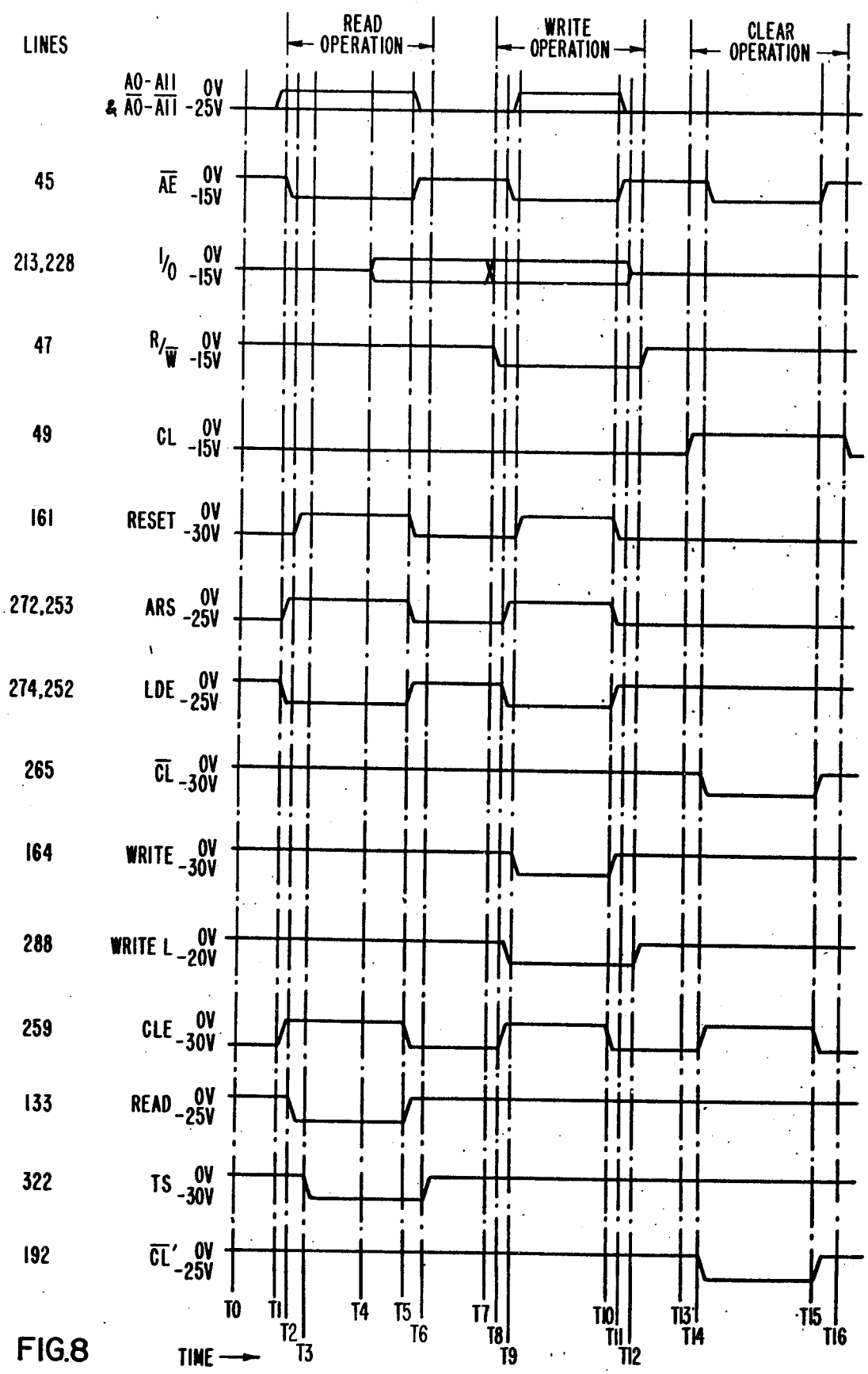
FIG. 8 shows waveforms for typical operation of the embodiment of FIG. 2 utilizing the control and buffer circuitry of FIGS. 3 through 7.

In the operation, address enable buffer 46 is controlled by two input signals $\overline{AE}$ and $\overline{CL}$ and generates four control signals REST, ARS, LDE and CLE. During read and write operations signal $\overline{CL}$ is at zero volts as shown in FIG. 8. During clear operation $\overline{CL}$ goes to −30 volts. To initiate read, write and clear operations $\overline{AE}$ signal on line 45 goes from zero to −15 volts.

At time T0 shown in FIG. 8, $\overline{AE}$ on line 45 is at zero volts transistor 257 is non-conducting causing line 259 to be low causing transistors 261, 262 and 263 to be conducting. Line 259 is low caused by transistor 260 which acts as a current source to −30 volts. With transistor 262 conducting, line 267 is high causing transistors 269, 270 and 271 to be non-conducting. With transistor 261 conducting, line 272 which provides signal ARS is low which causes transistor 273 to be conducting. With transistor 273 conducting and transistor 271 non-conducting, line 275 is high or at zero volts and transistor 277 is non-conducting with capacitor 276 fully discharged or at a first charged state. With transistor 277 non-conducting and transistor 264 conducting line 161 is pulled low to −30 volts with the help of transistor 279 which acts as a current source. With transistor 263 conducting and transistor 270 non-conducting, line 274 which provides signal LDE is pulled high to zero volts.

When $\overline{AE}$ goes from zero volts to −15 volts while signal $\overline{CL}$ remains at zero volts, at T1 and T8 in FIG. 8, transistor 257 is in a conducting state which causes line 259 to be high which in turn turns off transistors 261, 262 and 263. With transistor 262 non-conducting and transistor 268 acting as a current source, line 267 is pulled low which causes transistors 269, 270 and 271 to be in the conducting state. Line 272 is pulled high by transistor 269 which causes transistor 273 to be non-conducting. Line 274 is pulled low by transistor 270. Line 275 is pulled low after a slight delay caused by capacitor 276 by transistor 271 which is conducting, and causes transistor 277 to be in the conducting state. Transistor 277 pulls line 161 high or to zero volts which supplies enough current to transistor 279 which acts as a current source without pulling down line 161. The slight delay caused by CAPACITOR 276 in signal RESET allows the address signals to settle from the address buffers at row decoders 14 and 17 before the RESET signal goes from −30 volts to zero volts. When $\overline{AE}$ goes from −15 volts to zero volts the signals revert back to when $\overline{AE}$ is at zero volts. It is understood that by the use of P-channel depletion mode transistors, an input signal $\overline{AE}$ to $\overline{AE}$ buffer 46 may go from zero to <15 volts and cause output control signals to swing from zero to −30 volts.

Figure 5:
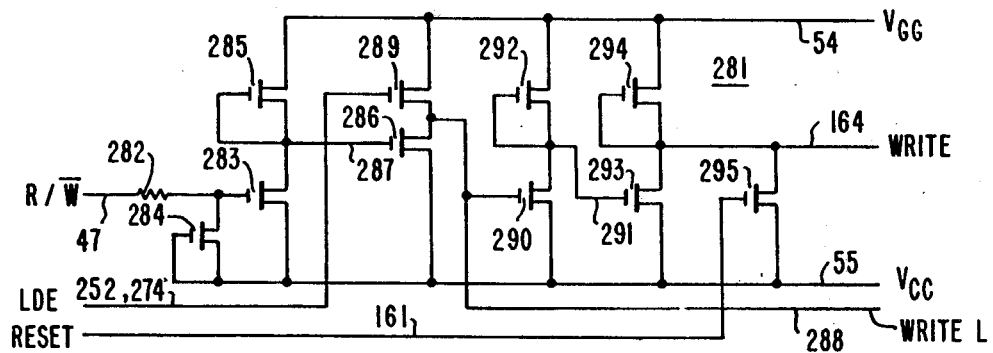
FIG. 5 shows a schematic diagram of read/write control circuitry.

FIG. 5 shows a schematic diagram of read/write control circuitry 281 which is a portion of R/$\overline{W}$ control circuitry 48 shown in FIG. 1. Signal R/$\overline{W}$ is coupled on line 47 through resistor 282 to the gate of transistor 283 and the drain of transistor 284. The gate and source of transistor 284 is coupled to voltage supply $V_{CC}$ or zero volts. Resistor 282 and transistor 284 function to protect transistor 283 from static electricity. The drain of transistor 283 is coupled to the gate and source of transistor 285 and the gate of transistor 286 over line 287. The drain of transistor 286 is coupled over line 288 to the source of transistor 289 and the gate of transistor 290. Signal LDE is coupled over line 252 to the gate of transistor 289. Line 288 provides signal WRITE L which is provided to the circuitry of FIGS. 2A and 2B, the input/output buffer 52. The drain of transistor 290 is coupled over line 291 to the gate and source of transistor 292 and the gate of transistor 293. The draim of transistor 293 is coupled over line 164 to the gate and source of transistor 294 and to the drain of transistor 295 signal reset is coupled over line 161 to the gate of transistor 295. Line 164 provides signal WRITE which is provided to the circuitry in FIGS. 2A and 2B, row decoders 14 and 17 and column decoder 43. The source of transistors 283, 286, 290, 293 and 295 are coupled to voltage supply $V_{CC}$ which is at zero volts. The drains of transistors 285, 289, 292, and 294 are coupled to voltage supply $V_{CC}$ which may be −30 volts.

During read operation as shown in FIG. 8, signal R/$\overline{W}$ is high or zero volts causing transistor 283 to be non-conducting. Signal LDE on line 252 goes low at T1 causing transistor 289 to be conducting and signal RESET on line 161 goes high at T2 after a slight delay after signal LDE goes low causing transistor 295 to be non-conducting. Transistor 285 acting as a current source pulls line 287 low which causes transistor 286 to be conducting. With transistor 286 and 289 being conductive, the size of the transistor channels are adjusted such that the conductivity of transistor 286 is sufficient so that when both transistors are conducting line 288 is pulled high to zero volts. Transistor 290 is non-conducting and transistor 292 acts as a current source to pull line 291 low which causes transistor 293 to be conducting. Transistor 293 supplies sufficient current to pull line 164 high to zero volts even though transistor 294 is conducting and acting as a current source. Transistor 295 may be initially conducting for a short time until RESET signal goes high at T2 wherein transistor 295 will be non-conducting. During read operation therefore signals write and write L remain high or at zero volts.

During write operation at T7, signal R/$\overline{W}$ goes from zero volts to −15 volts causing transistor 283 to be conducting pulling line 287 to zero volts. Resistor 282 and transistor 284 function to protect the gate of transistor 283 from excessive voltage such as from static electricity by providing a discharge path through transistor 284. With line 287 high, transistor 286 is non-conducting. Signal LDE on line 252 goes low at T8 when $\overline{AE}$ goes low at T8 which causes transistor 289 to be conducting and pulling line 288 low. With line 288 low, transistor 290 is conducting pulling line 291 high or to zero volts causing transistor 293 to be non-conducting. Reset signal which is initially low goes high at T9 after a short delay after LDE goes low at T8 causing transistor 295 to go from the conducting state to the non-conducting state. When transistor 295 is in the conducting state line 164 is pulled high to zero volts. When transistor 295 goes to the non-conducting state, line 164 is pulled low to −30 volts by transistor 294 which acts as a current source. Following write operation at T10, LDE goes from −25 volts to zero volts which causes transistor 289 to be non-conducting. With transistor 286 non-conducting and transistor 289 non-conducting line 288 remains at −20 volts as an open line. Also at T10 signal reset goes from zero volts to −30 volts which causes transistor 295 to be conducting and to pull line 164 up to zero volts which is signal write. At T12 R/$\overline{W}$ goes from −15 volts to zero volts which causes transistor 283 to be non-conducting. Line 287 goes low causing transistor 286 to be conducting which pulls line 288 up to zero volts. Transistor 290 is non-conducting and line 291 is pulled low which causes transistor 293 to be conducting.

Figure 6:
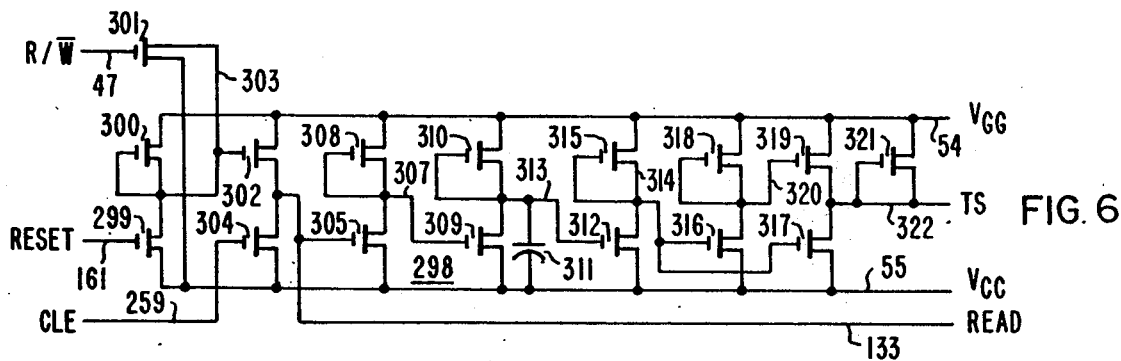
FIG. 6 shows a schematic diagram of read control circuitry.
Figure 7:
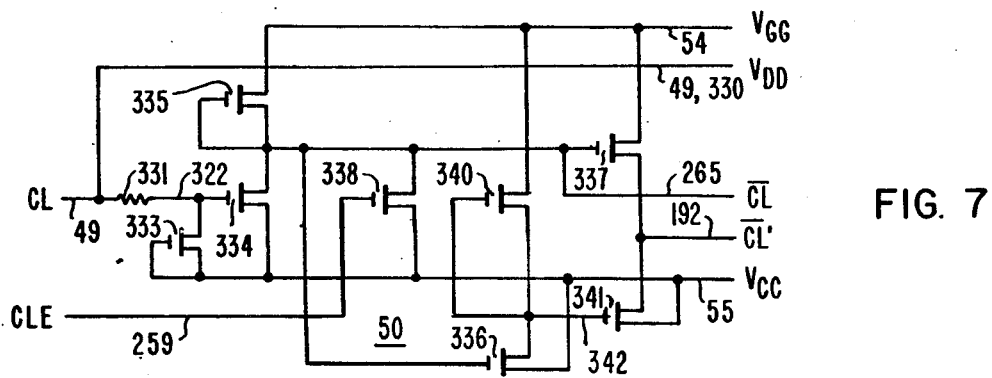
FIG. 7 shows schematic diagram of clear control circuitry.

FIG. 6 shows a circuit diagram of read control circuitry 298 which is a portion of R/$\overline{W}$ control circuit 48 shown on the block diagram in FIG. 1. Signal CLE on line 259 and signal Reset on line 161 are generated by $\overline{AE}$ buffer 46 shown in FIG. 4. Signal R/$\overline{W}$ is an external signal connected to R/$\overline{W}$ pad or line 47. R/$\overline{W}$ signal is also an input signal to read/write control circuitry 281 shown in FIG. 5. In FIG. 6, line 161 is coupled to the gate of transistor 299. The drain of transistor 299 is coupled to the gate and source of transistor 300 and the drain of transistor 301 and the gate of transistor 302 over line 303. Signal R/$\overline{W}$ on line 47 is coupled to the gate of transistor 301. Signal CLE on line 259 is coupled to the gate of transistor 304. The drain of transistor 304 is coupled to the source of transistor 302 and the gate of transistor 305 over line 133. The drain of transistor 305 is coupled over line 307 to the gate and source of transistor 308 and the gate of transistor 309. The drain of transistor 309 is coupled to the source of transistor 310 to one side of capacitor 311 and the gate of transistor 312 over line 313. The drain of transistor 312 is coupled over line 314 to the gate and source of transistor 315, the gate of transistor 316 and the gate of transistor 317. The drain of transistor 316 is coupled to the gate and source of transistor 318 and the gate of transistor 319 over line 320. The drain of transistor 317 is coupled to the source of transistor 319 and the gate and source of transistor 321 over line 322. The drain of transistors 300, 302, 308, 310, 315, 318, 319 and 321 are coupled to voltage supply $V_{GG}$. The source of transistors 301, 299, 304, 305, 309, 312, 316 and 317 as well as the other side of capacitor 311 are coupled to voltage supply $V_{CC}$ which may be zero volts. The output signals from read control circuitry 298 is signal TS on line 322 and signal Read on line 133. Signal Read is used in row decoders 14 and 17 and at read transistors 44 shown in FIGS. 2A and 2B. Signal TS is used at input/output buffer 52 also shown in FIGS. 2A and 2B.

In operation, read control circuitry 298 generates signals read and TS during read operation. During read operation R/$\overline{W}$ is high as shown in FIG. 8 causing transistor 301 to be non-conducting. Signal CLE is originally low at T0 causing transistor 304 to be conducting. Signal RESET is low at T0 causing transistor 299 to be conducting. Line 303 is therefore high causing transistor 302 to be non-conducting. Line 133 is high at zero volts by the conduction of transistor 304. Transistor 305 is non-conducting causing line 307 to be low which, in turn, causes transistor 309 to be conducting. Line 313 is high causing transistor 312 to be non-conducting causing line 314 to be low by the conduction of transistor 315 which acts as a current source. Transistors 316 and 317 are therefore conducting causing line 320 to be high and line 322 to be high at zero volts. Transistor 319 is non-conducting. Therefore at T0, before $\overline{AE}$ goes low at T1, signals READ and TS are at zero volts.

When signal CLE on line 259 goes high at T1, transistor 304 will be turned off. Signal R/$\overline{W}$ remains high which leaves transistor 301 in the non-conducting state. After a slight time delay signal RESET on line 161 at T2 goes from low or −30 volts to zero volts causing transistor 299 to be non-conducting. Transistor 300 acting as a current source pulls line 303 low causing transistor 302 to be conducting which, in turn, pulls line 133 low. With signal READ low on line 133, transistor 305 will be conducting causing line 307 to be high which, in turn, causes transistor 309 to be non-conducting. Line 313 will therefore be low due to the current source conduction of transistor 310 which after some delay by capacitor 311 will cause transistor 312 to be conducting. Line 314 will therefore be high causing transistors 316 and 317 to be non-conducting. Transistor 318 acting as a current source will pull line 320 low causing transistor 319 to be conducting which, in turn, will pull signal TS on line 322 low at T3. Transistor 321 will pull or assist in pulling line 322 low to −30 volts.

With both signals READ and TS low at T3 the read operation will be performed. Following the read operation, signal CLE at T5 goes from zero to −30 volts causing transistor 304 to be conducting. Also, signal RESET at T5 goes low to −30 volts from zero volts causing transistor 299 to be conducting which, in turn, pulls line 303 high causing transistor 302 to be non-conducting. Signal R/$\overline{W}$ remains at zero volts causing transistor 301 to be non-conducting. With transistor 304 conducting and transistor 302 non-conducting, line 133 is pulled high to zero volts which provides signal READ at T5. With line 133 at zero volts transistor 305 is non-conducting and line 307 is low. Transistor 309 is conducting when line 307 is low causing line 313 to be high which after some delay due to capacitor 311 causes transistor 312 to be non-conducting. Transistor 315 acting as a current source pulls line 314 low causing transistors 316 and 317 to be conducting. With transistor 316 conducting line 320 is pulled high causing transistor 319 to be non-conducting. With transistor 317 conducting and transistor 319 non-conducting line 322 is pulled high which provides signal TS at T6. Transistor 317 supplies sufficient current to hold line 322 high even though transistor 321 is acting as a current source. Therefore following READ operation at T6 both signals READ and TS are at zero volts as shown in FIG. 8.

FIG. 7 shows a schematic diagram of clear control circuitry 50 which is also shown in block form in FIG. 1. SIgnal CL on Line 49 also known as $V_{DD}$ is coupled to terminal 330 and through resistor 331 over line 332 to the drain of transistor 333 and the gate of transistor 334. The drain of transistor 334 is coupled to the gate and source of transistor 335, to the gate of transistors 336 and 337, and to the drain of transistor 338 over line 265. Signal CLE on line 259 is coupled to the gate of transistor 338. The drain of transistor 336 is coupled to the gate and source of transistor 340 and to the gate of transistor 341 over line 342. The drain of transistor 341 is coupled overline 192 to the source of transistor 337. Line 265 provides output signal $\overline{CL}$ and line 192 provides output signal $\overline{CL}'$. The drain of transistors 335, 337 and 340 are coupled to voltage supply $V_{GG}$. The source and gate of transistor 333 and the source of transistors 334, 336, 338 and 341 are coupled to voltage supply $V_{cc}$. Resistor 331 and transistor 333 function to protect transistor 334 from excessive voltage such as from static electricity by providing a discharge path. All the transistors in clear control circuitry 50 are P-channel enhancement mode transistors except for transistors 335 and 340 which are P-channel depletion mode transistors which act as a current source and pull its source low towards its drain voltage.

In operation, clear control circuitry 50 responds to signals CL and CLE to provide signals $\overline{CL}$ and $\overline{CL}'$ to enable clearing or setting of the memory transistors in memory array 12 to one threshold voltage state. Originally before clear operation, both signals CL and CLE are low causing transistors 334 and 338 to be conducting which causes line 265 to be high. With line 265 high transistor 336 is non-conducting causing line 342 to be low which, causes line 265 to be high. With line 265 high transistor 336 is non-conducting causing line 342 to be low which, in turn, causes transistor 341 to be conducting. With line 265 high, transistor 337 is non-conducting. With transistor 337 non-conducting and transistor 341 conducting, line 192 is pulled high to zero volts. Therefore, originally before clear operation both signals $\overline{CL}$ and $\overline{CL}'$ are high. When signal CL goes high at T13 shown in FIG. 8, transistor 334 becomes non-conducting. Line 265 remains high due to the conduction of transistor 338 which is held on by signal CLE. When signal CLE goes high at T14, transistor 338 becomes non-conducting which causes line 265 to go low to −30 volts. With line 265 low, transistors 337 and 336 are conducting. Transistor 337 pulls line 192 low to −39 voltss and transistor 336 pulls line 342 high to zero volts which causes transistor 341 to be non-conducting. Therefore, during clear operation with signals CL and CLE high the output of clear control circuitry 50 has signal $\overline{CL}$ low and $\overline{CL}'$ low or at −25 volts. After clear operation signal CLE goes from zero volts to −30 volts causing transistor 338 to be conducting which, in turn, pulls line 265 high to zero volts. Line 265 also causes transistor 336 to be non-conducting. Transistor 340 acting as a current source pulls line 342 low to −30 volts causing transistor 341 to be conducting which pulls line 192 high to zero volts. Therefore, when signal CLE goes low after clear operation, both output signals $\overline{CL}$ and $\overline{CL}'$ go high to zero volts. Next at T16, signal CL goes from zero volts to −15 volts which causes transistor 334 to conduct providing a second path in addition to transistor 338 for pulling line 265 high to zero volts. Clear control circuitry 50 remains inactive except during clear operation when signal $\overline{CL}$ goes to −30 volts and $\overline{CL}'$ goes from zero volts to −25 volts to facilitate clearing memory array 12 or setting the voltage thresholds of the memory array transistors to one state.

FIG. 8 shows waveforms for typical operation of the embodiment of FIGS. 1, 2A and 2B utilizing the buffer circuits shown in FIGS. 3 and 4 and the control circuitry shown in FIGS. 5 through 7. In FIG. 8 the ordinant represents voltage and the abscissa represents time. To read data from memory array 12, initially at time T0 row decode lines X1 through X128 are zero volts and lines 157, 158, 165 and 166 from column decoder 43 are at zero volts. Signal RESET is low causing transistors 159, 160, 167 and 168 in columm decoder 43 to be conducting causing the drains of all the memory transistors in a column to be coupled to their respective sources to zero volts. At time T1 signal $\overline{AE}$ on line 45 shown in FIG. 4 and FIG. 8 goes from zero volts to −15 volts causing signal ARS on lines 272 and 253 to go from −25 volts to zero volts which unclamps the output of address buffer 19 and of the other address buffers. Signal LDE on lines 274 and 252 goes from zero volts to −25 volts to enable the addresses to pass through the address buffers such as address buffer 19. Signal CLE on line 259 goes from −30 volts to zero volts and after a short delay signal RESET on line 161 at T2 goes from −30 volts to zero volts causing signal READ on line 133 in FIGS. 6 and 2 to go from zero volts to −25 volts which enables voltage $V_{DD}$ to pass through one of the decode trees in row decoders 14 and 17, according to the address, to put voltage supply $V_{DD}$ such as −15 volts on the selected row line which may, for example, be X1. All the other row lines in memory array 12 remain at zero volts since they were precharged to zero volts and since they have not been selected by the tree decode circuitry in row decoders 14 and 17, they remain at zero volts. When signal RESET on line 161 in FIG. 2 goes from −30 volts to zero volts transistors 159, 160, 167 in column decoder 43 are turned off and are non-conducting isolating or separating the source and drain terminals of the memory transistors. Also when signal RESET goes from −30 volts to zero volts, lines 155 and 156 in column decoder 43 are charged to zero volts and are floated or disconnected from signal $\overline{CL'}$ by transistors 194 and 195. At the same time RESET goes from −30 volts to zero volts at time T2, READ signal on line 133 goes from zero volts to −25 volts connecting the drains of the memory transistors in memory array 12 to line 136 which is connected to voltage supply $V_{GG}$ which may be at −30 volts. The selected row line, such as X1 will be at −15 volts which will cause memory transistors 60, 66, 140 and 146 to conduct current. The amount of current that each transistor conducts is dependent upon the voltage threshold of the particular memory transistor. One of the 32 columns Y1 through Y32, will be selected by column decoder 43 in accordance with address signals A7 through A11. The selected column will allow current to pass through the decode tree to read latch 154. For example, if column Y1 is selected along with row X1, transistors 60 and 66 will conduct current to lines 155 and 156. If both memory transistors had been cleared to a low threshold state and one memory transistor had been written to a high threshold state, then with a low threshold state would conduct more current than the transistor with the high threshold state. Therefore, either line 155 or 156 will be discharged at a faster rate than the other, resulting in read latch 154 setting in the information state indicative of which memory transistor had the highest conductivity or low threshold state. Read latch 154 latches when either transistor 191 or 193 becomes conducting. Line 192 is at zero volts allowing current to pass through the conducting transistor 191 or 193 pulling up its drain to zero volts which is fed to the gate of the other transistor and causing the other transistor 191 or 193 to be non-conducting. The drain of the non-conducting transistor remains low or continues to go lower in voltage towards −25 volts due to the continuing current passing through the memory transistor. The output of read latch 154 will therefore have one line high such as line 155 and one line low such as line 156. At time T3 signal TS goes from zero volts to −30 volts which permit the signals on lines 155 and 156 to pass into input/output buffer 52 and set line 51 high due to the conduction of transistor 212 and the non-conduction of transistor 214. If the information in the memory cell was such that line 155 was low and line 156 was high, then line 51 at input/output buffer 52 would be low due to the conduction of transistor 214 and the non-conduction of transistor 212. The time at which line 213 goes high or low depending upon the data from the selected memory cell on lines 155 and 156 is shown at time T4 in FIG. 8.

At T5 signal $\overline{AE}$ on line 45 goes from −15 volts to zero volts causing signal ARS on lines 272 and 253 to go from zero volts to −25 volts and signal LDE on lines 252 and 274 to go from −25 volts to zero volts which causes the address buffers 19 through 25 and 33 through 37 to disregard the input address signals and to clamp the output address signal to −30 volts. Also at T5, signal CLE on line 259 goes from zero volts to −30 volts which causes signal READ on line 133 to go from −25 volts to zero volts disconnecting voltage supply $V_{DD}$ from row decoders 14 and 17 shown in FIGS. 2A and 2B. At time T5 signal RESET on line 161 goes from zero volts to −30 volts which connects the row decoders 14 and 17 to voltage supply $V_{CC}$ which results in charging up all the row decode lines X1 through X128 to zero volts. In addition, signal RESET causes column decoder 43 to connect the drain and source terminals of the memory transistors together in each column and causes transistors 194 and 195 in read latch 154 to be conducting which resets read latch 154 to zero volts and couples zero volts through the column decoder 43 to the source and drain terminals of all the memory transistors in memory array 12. At time T6 signal TS on line 322 goes from −30 volts to zero volts disconnecting the input/output buffer 52 from read latch 154 and causing transistors 214 and 212 in input/output buffer 52 to be non-conducting which, in turn, cause line 51 to float or to be disconnected. At time T6 the read operation of memory array 12 may be considered completed.

To write into memory array 12 first signal $R/\overline{W}$ on line 47 goes from zero volts to −15 volts at T7 to indicate a write operation is desired in memory array 12. At time T8 signal $\overline{AE}$ on line 45 goes from zero volts to −15 volts which causes signals ARS on lines 272 and 253 to go from −25 volts to zero volts which unclamps the address signals from the address buffers 19 through 25 and 33 through 37 and signal LDE on lines 274 and 252 goes from zero volts to −25 volts which allows the address signals to propagate through the address buffers. Signal $\overline{AE}$ on line 45 also causes signal CLE on line 259 at time T8 to go from −30 volts to zero volts which causes signal WRITE L on line 288 shown in FIG. 5 and FIG. 2 as well as FIG. 8 to go from zero volts to −20 volts. At time T9 signal RESET on line 161 goes from −30 volts to zero volts which cause signal WRITE on line 164 to go from zero volts to −30 volts. Signal WRITE couples row decoders 14 and 17 to voltage supply $V_{GG}$ or −30 volts which will pass through the decode tree to the selected row line such as X1 which will be pulled to −25 volts. WRITE signal at column decoder 43 will cause the sources of the memory transistors of each column in memory array 12 to be coupled to voltage supply $V_{GG}$ or −30 volts. Input/output buffer 52 will have passed data through itself at time T8 to column decoder 43 on lines 155 and 156. One of lines 155 and 156 will be pulled high to zero volts while the other line will be pulled low to −25 volts. The line that will be pulled high to zero volts will pass through column decoder 43 and pull the source of the memory transistors in the coded column to zero volts and will supply sufficient current to overdrive the transistor pulling the sources of the decoder column to $V_{GG}$. For example, if line 155 is high or at zero volts, then line 157 will be near zero volts even through transistor 162 is conducting. If row X1 is selected, then the voltage from the gate to source and channel region of transistor 60 will be −25 volts which is enough voltage to shift the threshold voltage of memory transistor 60. The other memory transistor 66 in column Y1 in Row X1 will have −25 volts on the source and −25 volts on the gate which will result in no voltage between the gate and source of the memory transistor resulting in no shift in the threshold voltage of memory transistor 66. At time T10 signal $\overline{AE}$ on line 45 goes from −15 volts to zero volts which causes signals ARS on lines 272 and 253 to go from zero volts to −25 volts and LDE on lines 274 and 252 to go from −25 volts to zero volts causing all the address signals A0 through A11 and $\overline{A0}$ through $\overline{A11}$ to go to −30 volts. Signal CLE on line 259 goes from zero volts to −30 volts which causes signal RESET on line 161 to go from zero volts to −30 volts which, in turn, causes signal WRITE on line 164 to go from −30 volts to zero volts. The WRITE signal disconnects row decoders 14 and 17 from voltage supply $V_{GG}$. Signal RESET reconnects row decoders 14 and 17 to voltage supply $V_{CC}$ which causes all the rows from X1 through X128 in memory array 12 to be charged to zero volts. In addition, signal RESET in column decoder 43 causes the source and drain terminals of each column of memory transistors to be coupled together and causes transistors 194 and 195 to be conducting which couples zero volts through the column decoder to the source of the memory transistors in each column in memory array 12. At time T11 the data on line 51 may be removed from input/output buffer 52. At time T12, signal R/$\overline{\text{W}}$ on line 47 may go from −15 volts to zero volts causing signal WRITE L on line 288 to go from −20 volts to zero volts which disconnects input/output buffer 52 from column decoder 43. At time T12 the write operation is considered completed. It is understood that each memory cell comprises two transistors where all transistors are cleared to one threshold state and only one transistor is rewritten to another or high threshold state. The information stored in a particular memory cell is determined by which transistor in the memory cell is written to a high threshold state or vice versa. It is understood that a simpler memory cell could be used wherein only one memory transistor is used per memory cell and where a reference transistor is used in place of the second transistor in each memory cell of the memory array 12.

The operation of clearing every memory transistor in memory array 12 to the low threshold voltage state such as −2 volts may be performed utilizing the waveforms from T13 to T16 in FIG. 8. At T13 signal CL on line 49 goes from −15 volts to zero volts. At T14 signal $\overline{\text{AE}}$ on line 45 goes from zero volts to −15 volts which causes signal CLE on line 259 to go from −30 volts to zero volts which, in turn, causes signal $\overline{\text{CL}}$ on line 265 to go from zero volts to −30 volts. Signal $\overline{\text{CL}}'$ on line 192 goes from zero volts to −25 volts. Memory array 12 and column decoder 43 are in a separate silicon isolation region or n-type epitaxial tub or conductivity region than row decoders 14 and 17 and inputoutput buffer 52 to facilitate clearing the memory transistors in memory array 12. Initially all the row lines from row decoders 14 and 17 such as row lines X1 through X128 are at zero volts and remain at zero volts throughout the clear operation. When $\overline{\text{CL}}'$ goes to −25 volts, it pulls the silicon isolation region or tub to −25 volts which contains the memory array 12 and column decoder 43. The substrate or body of every memory transistor is therefore at −25 volts which causes a +25 volt drop between the gate which is at zero volts and the body of every memory transistor and resets or shifts the threshold voltage of every memory transistor to the low state such as −2 volts. At T15 signal $\overline{\text{AE}}$ on line 45 goes from −15 volts to zero volts which, in turn, causes signal CLE on line 259 to go from zero volts to −30 volts which causes signal $\overline{\text{CL}}$ on line 265 to go from −30 volts to zero volts. Signal $\overline{\text{CL}}'$ on line 192 goes from −25 volts to zero volts which raises the voltage of the silicon substrate or silicon isolation region containing memory array 12 and column decoder 43 back to zero volts. With the silicon isolation region at zero volts and the gate voltage at zero volts, there is no voltage across the memory transistors of memory array 12. At T16 signal CL on line 49 goes from zero volts to −15 which completes the sequence of signals for clearing or resetting the threshold voltage of every memory transistor in memory array 12.

Figure 9:
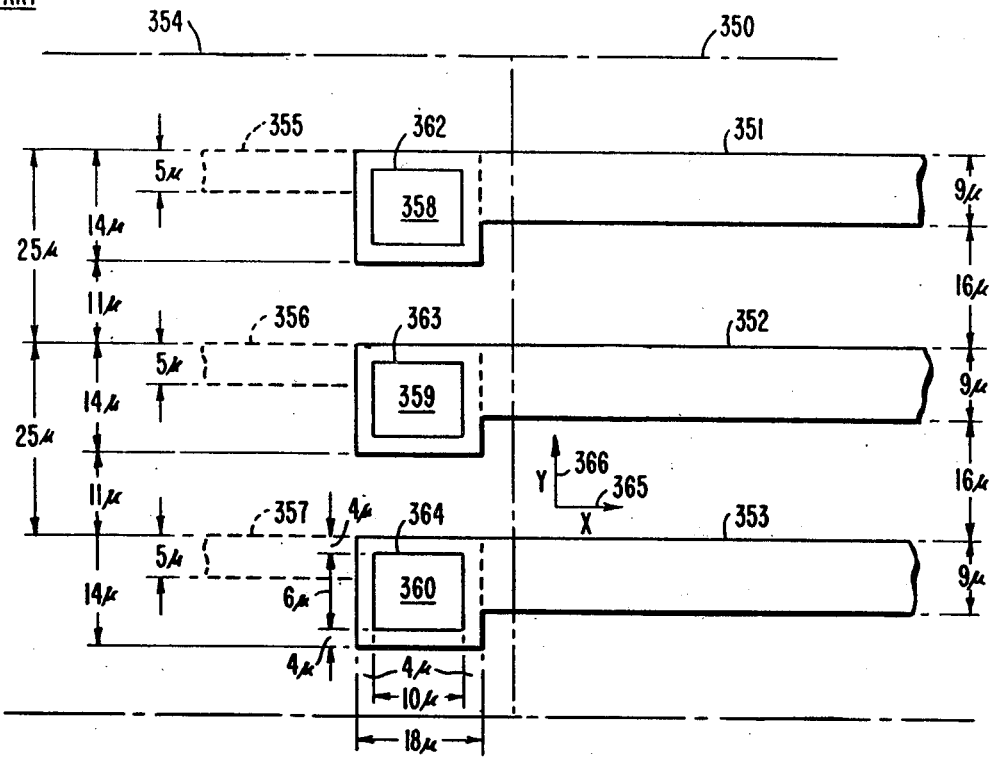
FIG. 9 shows a prior art plan diagram of the spacing between row select lines in a memory array utilizing one row decoder.

FIG. 9 shows a prior art plan diagram of the spacing between row select lines in a memory array utilizing one row decoder. In FIG. 9 memory array 350 has row select lines 351 through 353 in the X direction 365 which may, for example, be metal lines having a minimum width of 9 microns and minimum spacing of 6 microns due to limitations in processing. Memory array 350 may, for example, have a plurality of variable threshold transistors arranged in columns and rows (not shown) such that memory row select line 351 extends across memory array 350 and is coupled to the gates of the variable threshold transistors in its row. Likewise row line 352 may be coupled to the gates of the variable threshold transistors in the next row adjacent to the row of transistor connected to row line 351. Row 353 is coupled to the gates of the variable threshold transistors in the next row adjacent the variable threshold transistors in the row coupled together by row line 352. If each row line 351 through 353 has a width of 9 microns, then the spacing between row lines is 16 microns for a row line center-to-center spacing of 25 microns. Row decoder 354 provides signals to row lines 351 through 353. Row decoder 354 has its signals on P+ diffusion lines 355 through 357 which are connected to the metalization of row lines 351 through 353 respectively through diffusion contact areas 358 through 360. Diffusion contact area 358 has an oxide window 362 which is in the form of a square in the center of contact area 358. The P+ diffusion 355 extends under the entire contact area 358 having dimensions 14 microns by 18 microns. Metalization 351 extends over the entire area of contact area 358 having the same dimensions of 14 microns by 18 microns. A 4-micron band of oxide surrounds the perimeter of the contact area 358 between metalization 351 and P+ diffusion 355. Metalization 351 is in intimate contact with P+ diffusion line 355 in the area of oxide window 362 where no oxide exists. Diffusion contact area 359 likewise has an oxide window 363 and diffusion contact area 360 has an oxide window area 364. As shown in FIG. 9 the dimensions of oxide window area 359 and 360 are the same as oxide window area 358, 6 microns by 10 microns and located in the center of the overlap between the P+ diffusions 356 and 357 and the metalization 352 and 353 to leave a 4-micron width layer of oxide around the perimeter of the overlap of the P+ diffusion and metalization. P+ diffusion lines 355 through 357 have a minimum width of 5 microns. Another process limitation, due to process limitation for carrying 25 volt signals, requires 11 micron spacing between P+ to P+ diffusions such as P+ diffusion 355 and P+ diffusion 356. Since the P+ diffusions extend under diffusion contact areas 358 and 359, the diffusion contact areas must be spaced apart by at least 11 microns. If the minimum width of the contact area in the Y direction as shown by direction arrow 366 is 14 microns and the spacing between areas is 11 microns, then the center-to-center spacing is 25 microns as shown in FIG. 9. The Y direction arrow 366 is orthogonal to the X direction arrow 365 wherein the X direction arrow 365 is parallel to row lines 351 through 353. The minimum spacing between row lines 351 through 353 is therefore dictated by the diffusion contact areas 358 through 360 of row decoder 354 causing memory array 350 to have greater spacing than necessary resulting in additional area being taken up by memory array 350 than required by the minimum spacings required by the processes available. For example, the spacing between metal line 351 and 352 need only 6 microns, the minimum spacings instead of the 16 microns shown in FIG. 9.

Figure 10:
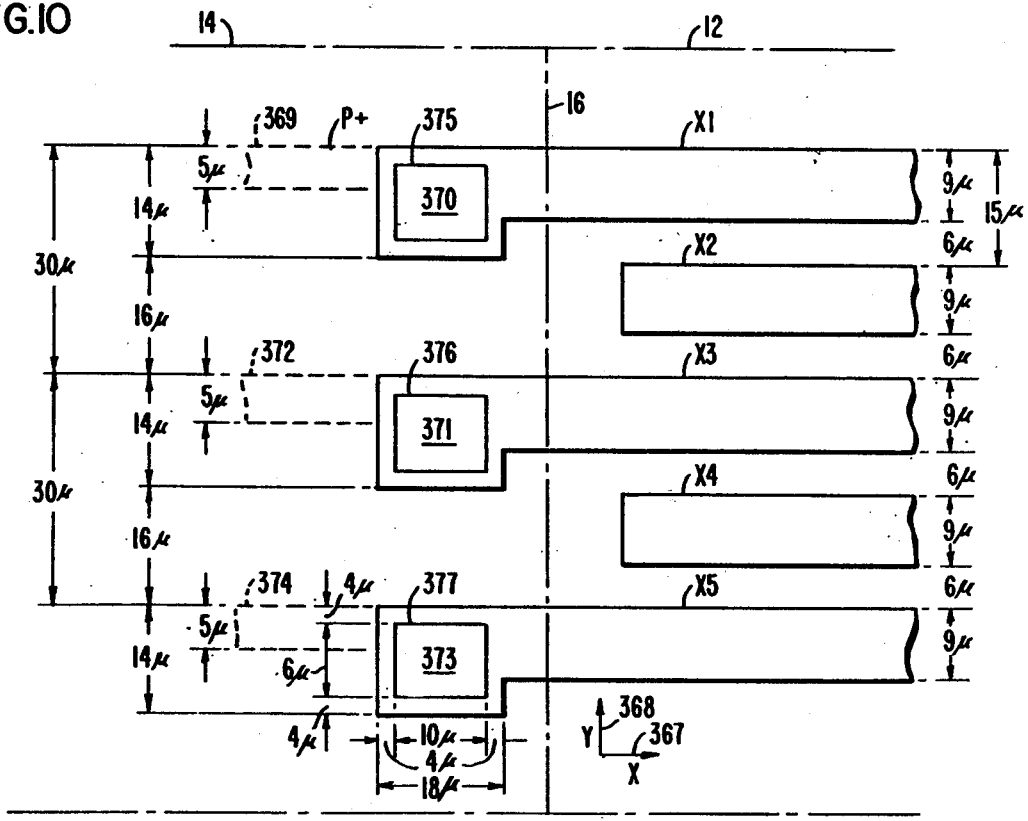
FIG. 10 shows a plan diagram of the spacing between row select lines in the memory array utilizing two row decoders as shown in FIG. 2.

FIG. 10 shows a plan diagram of the spacing between row select lines in a memory array of transistor (not shown) utilizing two row decoders as shown in FIGS. 2A and 2B. Row decoder 14 has row select lines X1 through X5 which extend into memory array 12 and are parallel to X direction arrow 367. The metalization line widths are 9 microns as shown in FIG. 10 which is the minimum due to process limitations. Row select line X1 is coupled to P+ diffusion line 369 by means of diffusion contact area 370. Row select line X3 is coupled through diffusion contact area 371 to P+ diffusion line 372. Row select line X5 is coupled through diffusion contact area 373 to P+ diffusion line 374. P+ diffusion lines 369, 372 and 374 have a minimum width of 5 microns. Diffusion contact areas 370, 371 and 373 have a minimum width of 14 microns which is in the Y direction as shown by Y direction arrow 368 which is orthogonal to X direction arrow 367. Diffusion contact areas 370, 371 and 373 have inside the peripheral edges an oxide window area 375 through 377 respectively. The oxide window area has a dimension of 6 microns in the Y direction and 10 microns in the X direction with a 4-micron width from the edge of P+ diffusion or the metalization of the row select line. As shown in FIG. 2 row decoder 17 has row select lines X2 and X4 which are partially shown in FIG. 10 where they extend to the left side of memory array 12. Row select lines X2 and X4 are metal and have a minimum width of 9 microns due to process limitations. The minimum spacing between metalization lines X1 and X2 or other lines running parallel is 6 microns due to process limitations. FIG. 10 therefore shows a layout for row select lines which enter memory array 12 from side 16 and the other side 15 to provide a maximum density memory array 12. As shown in FIG. 10 the center-to-center spacing of the row select lines are 15 microns. The P+ diffusion contact areas 370 through 373 for row decoder 14 are on 30-micron centers. The P+ diffusion spacing between diffusion contact areas 370 and 371 is 16 microns which exceeds the 11-micron spacing which is the minimum spacing due to a 25 volt signal requirement. The layout in FIGS. 2A, 2B and 10 requires area for 2 row decoders 14 and 17 on either side of memory array 12 and area for address interconnects 18 which is merely room for running metalization lines from the address signals A0 through A6 and their complements to row decoders 14 and 17. By placing row decoders 14 and 17 on either side of memory array 12 the density or packing of the memory cells in memory array 12 is optimized resulting in less area for an overall memory chip even though additional area is required for a second row decoder and for running address interconnection lines to the second row decoder. In memory arrays larger than 4K a small penalty in row decoder area is required to double the memory size because approximately 25 microns in the X direction is needed for adding one additional decode transistor. The smaller the area of the memory chip or die results in more chips per wafer which results in a lower cost per chip.

The invention provides an electrically alterable non-volatile memory for storing information comprising a substrate, an array of electrically alterable non-volatile memory elements arranged in a number of rows in a predetermined area on the substrate, the rows being colinear and parallel to one another and extending to a first and second side of the area, a first group of at least two rows interleaved between a second group of at least three rows, the memory elements of each row of the first and second groups coupled to a conductor running along each row, first decode logic coupled to the conductors of the first group of rows on the first side of the area for selecting one of the rows in response to a number of predetermined addresses, second decode logic coupled to the conductors of the second group of rows on the second side of the area for selecting one of the rows in response to a number of predetermined addresses, and means coupled to the array of memory elements for clearing the array of memory elements to a first predetermined threshold voltage, means coupled to the array of memory elements for writing selected memory elements to a second predetermined threshold voltage, and means coupled to the array of memory elements for reading selected memory elements.

The invention further provides a semiconductor memory array for storing information comprising a plurality of memory cells arranged in a matrix having a plurality of rows and a plurality of columns, each of the memory cells include at least one variable threshold field effect transistor, means for clearing all of the memory cells to a first information state by setting the threshold voltage of each of the variable threshold transistors to a predetermined voltage in the memory cells, means for writing a second information state into a selected memory cell by varying the threshold voltage of one of the variable threshold transistors in the memory cell, and means for reading information for a selected memory cell by sensing the information state of the selected memory cell, wherein the means for writing and means for reading includes circuitry utilizing P-channel depletion mode field effect transistors having a gate, source and drain electrode to eliminate a threshold voltage drop between the gate and source electrode to permit the voltage of the source to be pulled to the potential of the drain.

The invention further provides a non-volatile semiconductor memory array row decoder for precharging a plurality of rows of memory cells in the array at a first time and for selecting one of the rows at a second time following the first time comprising a first circuit node, a plurality of circuit paths from said first circuit node to each of the rows, each of the circuit paths including a plurality of field effect transistors, each having a gate, source and drain electrode, connected in series between the source and drain electrodes, means for coupling a plurality of address signals to the gates of the transistors to cause one circuit path to conduct current in response to the plurality of address signals, each address signal may be represented by its true or complement level, means for coupling the first circuit node to a first supply voltage in response to a writer signal, means for coupling the first circuit node to a second supply voltage in response to a read signal and means for coupling the first circuit node to a third supply voltage in response to a reset signal to precharge to a predetermined voltage, through the plurality of circuit paths, the plurality of rows at times when the potential of the plurality of address signals are all at a voltage to cause the transistors to conduct current.

The invention further provides a non-volatile semiconductor array address buffer for level shifting an address signal at times and for providing a predetermined potential at other times comprising a first field effect transistor having its gate coupled to an input address terminal, its source coupled to a first voltage supply, its drain coupled to the source of a second field effect transistor and to the gate of a third field effect transistor, the gate of the second transistor coupled to a first control signal terminal, the drain of the third transistor coupled to the source of a fourth field effect transistor and to the gate of a fifth field effect transistor, the drain of the fifth transistor coupled to the source of the sixth transistor, the drain of a seventh field effect transistor and to the gate of an eighth effect transistor, the sources of the third, fifth and eighth transistors coupled to the first power supply, the gates of the fourth and sixth transistors coupled to the first control signal terminal, the drain of the eighth transistor coupled to the source of a ninth field effect transistor, to the gate and source of a tenth field effect transistor and to an address output terminal, the drains of the second, fourth, sixth, ninth and tenth transistors coupled to a second voltage supply, and the gates of the seventh and ninth transistors coupled to a second control signal terminal.

The invention further provides an electrically alterable non-volatile semiconductor array for storing information comprising a plurality of memory cells arranged in rows and columns to form the array, each of the memory cells comprising at least one variable threshold field effect transistor, the drain electrodes of one transistor per memory cell in a column of memory cells coupled together, the source electrodes of the one transistor per memory cell in the column of memory cells coupled together, first means for precharging to a potential the gates of the transistors at times prior to reading information from the array, second means for precharging to a potential the source and drain electrodes of the transistors at times prior to reading information from the array, means for writing information into the array and means for reading information from the array.

We claim:

1. A non-volatile semiconductor memory array address buffer for level shifting an address signal at times and for providing a predetermined potential at other times comprising:

a first field effect transistor having its gate coupled to an input address terminal, its source coupled to a first voltage supply, its drain coupled to the source of a second field effect transistor and to the gate of a third field effect transistor, the gate of said second transistor coupled to a first control signal terminal, the drain of said third transistor coupled to the source of a fourth field effect transistor and to the gate of a fifth field effect transistor, the drain of said fifth transistor coupled to the source of said sixth transistor, the drain of a seventh field effect transistor and to the gate of an eighth field effect transistor, the sources of said third, fifth, seventh and eighth transistors coupled to said first power supply, the gates of said fourth and sixth transistors cupled to said first control signal terminal, the drain of said eighth transistor coupled to the source of a ninth field effect transistor, to the gate and source of a tenth field effect transistor and to an address output terminal, the drains of said second, fourth, sixth, ninth and tenth transistors coupled to a second voltage supply, and the gates of said seventh and ninth transistors coupled to a second control signal terminal.

2. The address buffer of claim 1 wherein said tenth transistor is of the depletion mode P-channel type to pull the potential of its source to the potential of said second voltage supply at times when said eighth transistor is non-conducting.

3. A semiconductor memory array for storing information conprising:

a plurality of memory cells arranged in a matrix having a plurality of rows and a plurality of columns;

each of said memory cells including at least one variable threshold field effect transistor;

means for clearing all of said memory cells to a first information state by setting the threshold voltage of each of said variable threshold transistors to a predetermined voltage in said memory cells;

means for writing a second information state into a selected memory cell by varying the threshold voltage of one of said variable threshold transistors in said memory cell; and means for reading information from a selected memory cell by sensing the information state of said selected memory cell, wherein said means for writing and means for reading includes circuitry utilizing P-channel depletion mode field effect transistors having a gate, source and drain electrode to eliminate a threshold voltage drop between said gate and source electrode to permit the voltage of said source to be pulled to the potential of said drain.

* * * * *